US008969176B2

(12) United States Patent
Fillmore et al.

(10) Patent No.: US 8,969,176 B2
(45) Date of Patent: Mar. 3, 2015

(54) LAMINATED TRANSFERABLE INTERCONNECT FOR MICROELECTRONIC PACKAGE

(75) Inventors: Ward G. Fillmore, Hudson, MA (US); William J. Davis, Hollis, NH (US)

(73) Assignee: Raytheon Company, Waltham, MA (US)

( * ) Notice: Subject to any disclaimer, the term of this patent is extended or adjusted under 35 U.S.C. 154(b) by 518 days.

(21) Appl. No.: 12/959,549

(22) Filed: Dec. 3, 2010

(65) Prior Publication Data

US 2012/0139100 A1    Jun. 7, 2012

(51) Int. Cl.
| | | |
|---|---|---|
| *H01L 21/44* | (2006.01) | |
| *H01L 21/00* | (2006.01) | |
| *B81C 1/00* | (2006.01) | |
| *H01L 23/544* | (2006.01) | |
| *H01L 21/683* | (2006.01) | |

(52) U.S. Cl.
CPC .......... B81C 1/00301 (2013.01); H01L 23/544 (2013.01); H01L 21/6835 (2013.01); *H01L 2221/68359* (2013.01); *H01L 2221/68363* (2013.01); *H01L 2221/68381* (2013.01); *H01L 2223/54426* (2013.01); *H01L 2924/00013* (2013.01); *B81B 2207/092* (2013.01); *B81B 2207/095* (2013.01); *H01L 2924/0002* (2013.01)
USPC ............................ 438/464; 438/612; 438/613

(58) Field of Classification Search
USPC ......................................... 438/464, 612, 613
See application file for complete search history.

(56) References Cited

U.S. PATENT DOCUMENTS

| | | | | |
|---|---|---|---|---|
| 6,426,564 | B1 * | 7/2002 | Ball ............................. | 257/783 |
| 6,730,541 | B2 * | 5/2004 | Heinen et al. ................. | 438/108 |
| 6,939,738 | B2 * | 9/2005 | Nakatani et al. ............. | 438/108 |
| 7,078,821 | B2 * | 7/2006 | Matsunami ................... | 257/780 |
| 7,226,812 | B2 * | 6/2007 | Lu et al. ....................... | 438/114 |
| 7,553,699 | B2 * | 6/2009 | Lee ............................... | 438/110 |
| 7,833,897 | B2 * | 11/2010 | Knickerbocker et al. ..... | 438/613 |
| 7,947,978 | B2 * | 5/2011 | Lin et al. ......................... | 257/48 |
| 8,035,219 | B2 | 10/2011 | Davis | |
| 8,043,893 | B2 * | 10/2011 | Furman et al. ............... | 438/108 |
| 8,062,961 | B1 * | 11/2011 | Motohashi ................... | 438/463 |
| 8,283,208 | B2 * | 10/2012 | Koyanagi ...................... | 438/109 |
| 2001/0010945 | A1 * | 8/2001 | Miyazaki ...................... | 438/107 |

(Continued)

FOREIGN PATENT DOCUMENTS

| | | |
|---|---|---|
| EP | 0 810 659 A2 | 12/1997 |
| EP | 0 810 659 A3 | 12/1997 |

(Continued)

OTHER PUBLICATIONS

Notification of Transmittal of the International Search Report dated Oct. 5, 2009, PCT/US2009/048079.

(Continued)

*Primary Examiner* — James Mitchell
(74) *Attorney, Agent, or Firm* — Daly, Crowley, Mofford & Durkee, LLP

(57) ABSTRACT

A package for a plurality of semiconductor devices having: an electrical interconnect structure, comprising: an electrical interconnect structure; and an active device structure, comprising the plurality of semiconductor devices on an active device substrate. The electrical interconnect structure is bonded to the active device structure and the electrical interconnect structure provides electrical interconnection among the semiconductor devices.

16 Claims, 7 Drawing Sheets

(56) References Cited

U.S. PATENT DOCUMENTS

| | | | |
|---|---|---|---|
| 2004/0245608 A1* | 12/2004 | Huang et al. | 257/676 |
| 2005/0019982 A1* | 1/2005 | Wakabayashi et al. | 438/108 |
| 2006/0220173 A1 | 10/2006 | Gan et al. | |
| 2007/0108579 A1 | 5/2007 | Bolken et al. | |
| 2007/0181979 A1 | 8/2007 | Beer et al. | |
| 2008/0064142 A1 | 3/2008 | Gan et al. | |
| 2009/0186425 A1* | 7/2009 | Mizukoshi et al. | 438/7 |
| 2010/0013088 A1 | 1/2010 | Davis | |
| 2010/0230474 A1* | 9/2010 | Buchwalter et al. | 228/176 |
| 2010/0261311 A1* | 10/2010 | Tsuji | 438/109 |
| 2012/0009735 A1 | 1/2012 | Davis | |
| 2012/0018857 A1* | 1/2012 | McConnelee et al. | 257/659 |
| 2012/0119388 A1* | 5/2012 | Cho et al. | 257/778 |

FOREIGN PATENT DOCUMENTS

| | | | |
|---|---|---|---|
| FR | 2 780 200 | | 12/1999 |
| JP | 09-186162 | * | 7/1997 |

OTHER PUBLICATIONS

The International Search Report dated Oct. 5, 2009, PCT/US2009/048079.

Written Opinion of the International Searching Authority dated Oct. 5, 2009, PCT/US2009/048079.

* cited by examiner

LAMINATED TRANSFERABLE INTERCONNECT FOR MICROELECTRONIC PACKAGE

TECHNICAL FIELD

This invention relates generally to methods for packaging (i.e., encapsulating) semiconductors and more particularly to methods for packaging semiconductors at a wafer level (i.e., wafer-level packaging).

BACKGROUND AND SUMMARY

As is known in the art, traditionally in the microelectronics industry, electrical devices are fabricated on wafers and then diced into individual chips. The bare chips would then get assembled with other components into a package for environmental and mechanical protection. In commercial applications, the chips were generally assembled into plastic packages. In military applications, where electronics are generally exposed to harsher environments, the parts are generally housed in a hermetic module. Such packages or modules would then be further assembled unto circuit boards and systems. However, as electronic systems advance, there is a need to increase functionality while decreasing the size and cost of components and sub-systems.

In accordance with the present disclosure, a package for a plurality of semiconductor devices is provided comprising: an electrical interconnect structure; and an active device structure, comprising the plurality of semiconductor devices on an active device substrate. The electrical interconnect structure is bonded to the active device structure and the electrical interconnect provides electrical interconnection among the semiconductor devices.

In one embodiment, a method is provided for packaging a plurality of semiconductor devices. The method includes: forming an electrical interconnect structure, comprising: a support substrate; a release layer on the support substrate; and a patterned electrical interconnect over the release layer. An active device structure is formed, comprising: forming the plurality of semiconductor devices on an active device substrate. The electrical interconnect structure is bonded to the active device structure.

In one embodiment, electrical interconnections are made between the active devices and the patterned electrical interconnect; and wherein the support substrate is removed from the bonded electrical interconnect structure and the active device structure.

In one embodiment, the support substrate is removed from the bonded electrical interconnect structure and the active device structure.

In one embodiment, a method is provided for packaging a plurality of semiconductor devices. The method includes: forming an electrical interconnect structure, comprising: a support substrate; a release layer on the support substrate; and a patterned electrical interconnect over the release layer; forming an active device structure, comprising: forming the plurality of semiconductor devices on an active device substrate; bonding the electrical interconnect structure to the active device structure;

In one embodiment, the method includes making electrical interconnections between the active devices and the patterned electrical interconnect structure; and; removing the support substrate from the bonded electrical interconnect structure and the active device structure.

In one embodiment, the removing comprises chemically removing the release layer.

In one embodiment, the removing comprises dissolving the release layer.

In one embodiment, the electrical interconnect structure is a laminated structure comprising a plurality of patterned electrical interconnects, each one of the of patterned electrical interconnects being separated by a dielectric layer.

In one embodiment, a method is provided for packaging a plurality of semiconductor devices. The method includes: forming an electrical interconnect structure, such interconnect structure comprising: a support substrate; a release layer on the support substrate; and a patterned electrical interconnect over the release layer; forming an active device structure, comprising: forming the plurality of semiconductor devices in the surface portion of the surface of the semiconductor wafer; bonding the electrical interconnect structure to the active device structure including making electrical interconnections between the active devices and the patterned electrical interconnect; and removing the support substrate from the bonded electrical interconnect structure and the active device structure comprising chemically removing the release layer.

In one embodiment, the electrical interconnect structure is a laminated structure comprising a plurality of patterned electrical interconnects, each one of the of patterned electrical interconnects being separated by a dielectric layer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
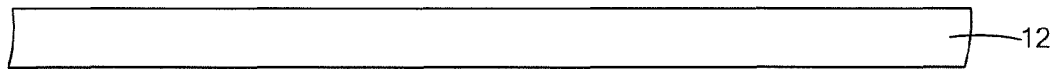
FIGS. 1A through 1L are simplified cross-sectional views showing an electrical interconnect structure at various stages in the fabrication thereof.
Figure 1B:
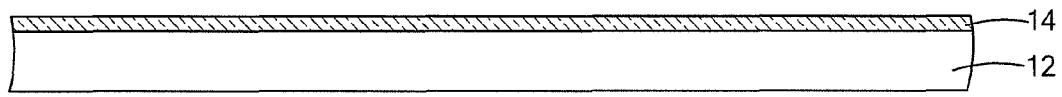
Figure 1C:
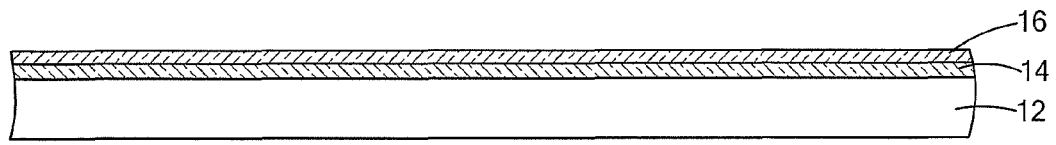
Figure 1D:
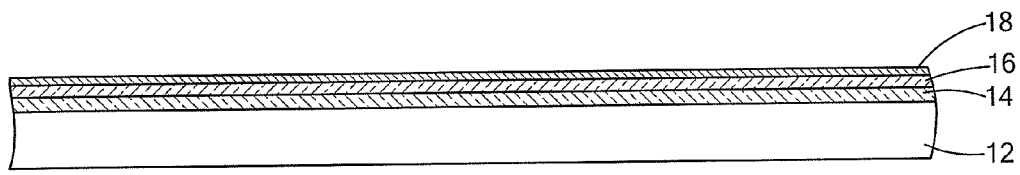
Figure 1E:
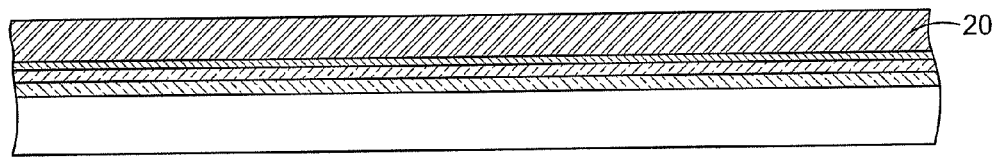
Figure 1F:
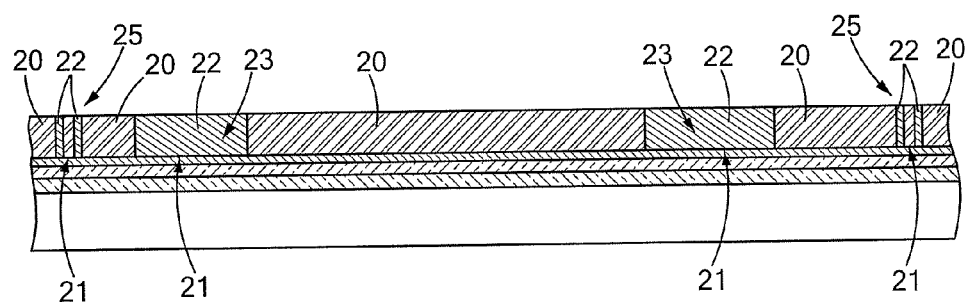
Figure 1G:
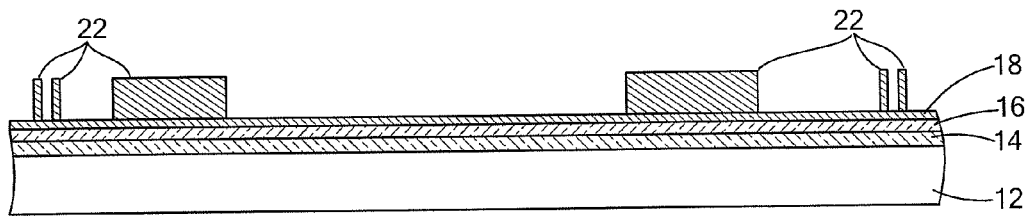

Referring now to FIGS. 1A through 1L, an electrical interconnect structure 10 (FIG. 1L) is formed. More particularly, a low cost transparent substrate 12 (FIG. 1A) is provided, such as glass or silicon having a thickness in the order of, for example, 500 microns. A release layer 14 (FIG. 1B) material is applied to coat the upper surface of the substrate 12. Next, a top dielectric layer 16 (FIG. 1C) of here, for example, BCB is applied to the surface of the release layer 14. Next, a seed layer 18 (FIG. 1D) of here for example, gold, is vacuum deposited or sputter deposited over the top dielectric layer 16 here, for example, to a thickness of 1000 to 2000 Angstroms. Next, a photoresist layer 20 (FIG. 1E) is coated over the seed layer 18 and photo lithographically masked and etched to form a predetermined pattern of windows (not shown) to expose regions 21 of the seed layer 18 where electrical interconnects 23 and alignment targets 25 are to be formed. Next, electroplating of a conductive layer 22 (FIG. 1F) here, for example, gold is performed on the exposed regions 21 of the seed layer 18 to build up the thickness of the desired electrical interconnects and passive elements, to be described. Here, for example the thickness of the interconnects and passive elements is in the order of 4-5 microns electrical interconnects.

Figure 1H:
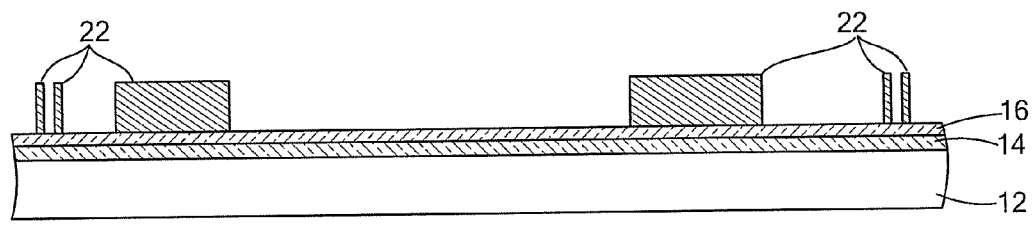
Figure 1I:
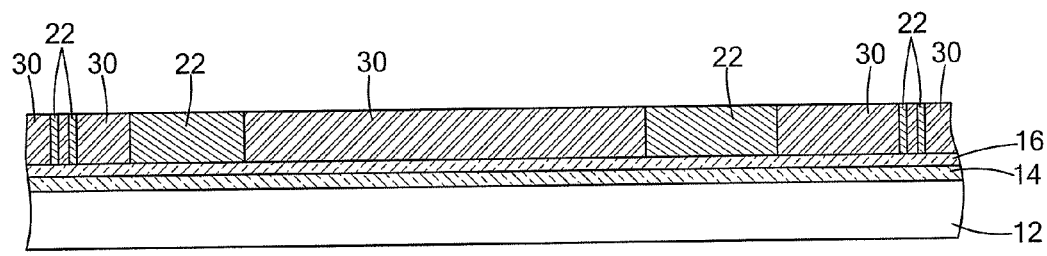
Figure 1J:
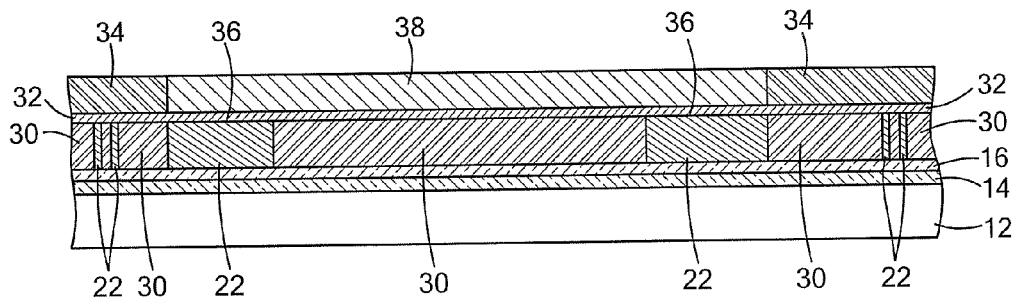

Next, the photoresist layer 20 is removed using any conventional process (FIG. 1G) followed by removal of the underlying seed layer 18 using for example potassium cyanide (FIG. 1H). Next, a second dielectric layer 30, here for example BCB, is coated over the resulting structure, as shown in FIG. 1I. Next, a second seed layer 32 (FIG. 1J) of for example gold is deposited over the second dielectric layer 30. Next, a second photoresist layer 34 (FIG. 1J) is coated over the seed layer 32 and patterned using conventional photolithographic processing to having windows formed therein to expose predetermined selected regions 36 of the second seed layer 32, as shown. The pattern in the second photoresist layer 34 is selected to form an upper level of electrical interconnects, passive components such as transmission lines, impedance matching structures, inductors to be described. The selected exposed regions of the second seed layer 32 are electroplated with a conductive material 38, for example gold, to build up the thickness of second level of layer of electrical interconnects to the desired second level of electrical interconnects, passive components such as transmission lines, impedance matching structures, inductors to be described. Here, for example the thickness of the interconnect layer 38 is in the order of 4-5 microns. Thus, an electrical interconnect is formed by layers 20, 32 and 38 as shown in FIG. 1J.

Figure 1K:
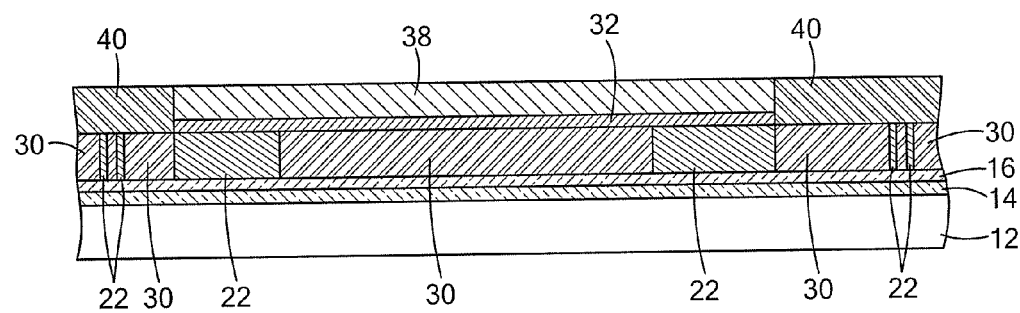
Figure 1L:
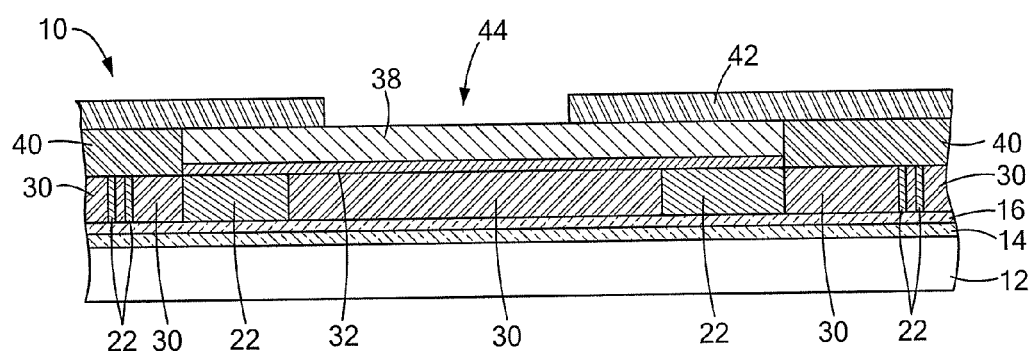

Next, the second photoresist layer 34 is selectively removed and the underlying portions of the second seed layer 32 are etched away (it being noted that the portions of the seed layer 32 under layer 38 remain) followed by removal of the dielectric layer 30 (FIG. 1K). Next, a third, top, dielectric layer 40 (FIG. 1K), here for example, BCB is coated over the resulting structure as shown in FIG. 1K. Next, an uncured glue layer 42, here, for example, BCB is coated over the top dielectric layer 40 and over layer 38, and then patterned with a window 44, as shown in FIG. 1L to complete the interconnect structure 10.

Figure 2A:
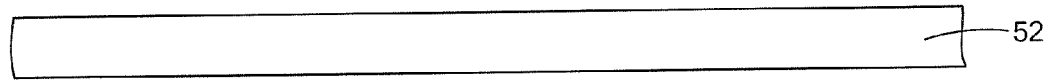
FIGS. 2A through 2D are simplified cross-sectional views showing an active device structure at various stages in the fabrication thereof.
Figure 2B:
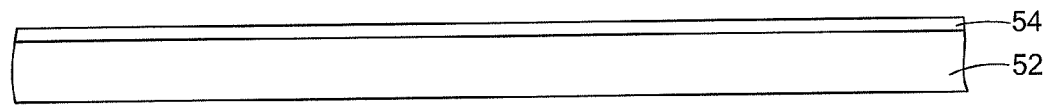
Figure 2C:
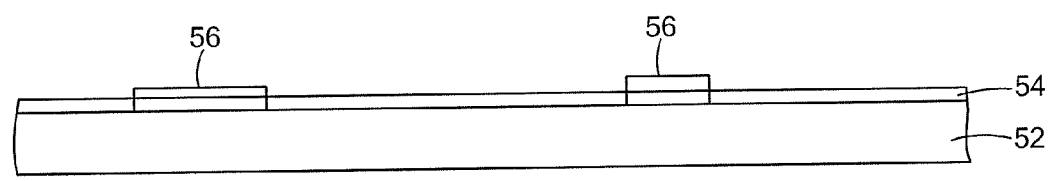
Figure 2D:
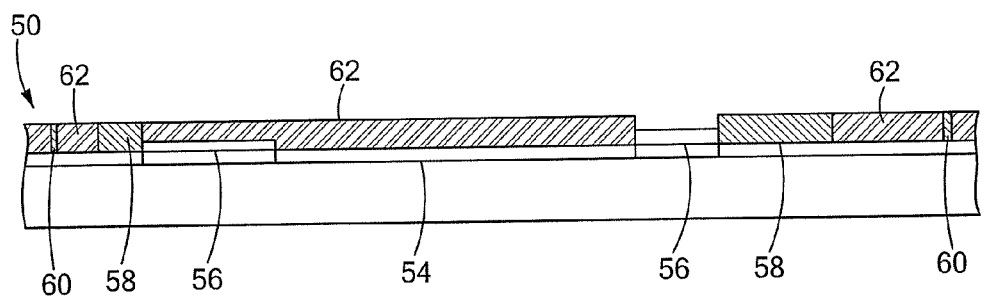

Referring to FIGS. 2A-2D, an active device sub-assembly or structure 50 (FIG. 2D) is formed. More particularly, a high cost active substrate 52 (FIG. 2A), for example a semiconductor substrate 52, for example, GaN, is provided. A semiconductor epitaxial layer 54 (FIG. 2B), here GaN, for example, is deposited or grown over the active substrate 52. Next, active devices 56 such as field effect transistors and passive components such as transmission lines, impedance matching structures, inductors or capacitors, for example, are formed in the surface of the structure, as shown in FIG. 2C). Next, electrically conductive contact pads 58 and alignment structures 60, here for example, gold, are formed over the structure using any conventional photolithographic deposition processes. Next, a dielectric bond layer 62, here for example BCB, is applied over the active device structured 50, as shown in FIG. 2D.

Figure 3A:
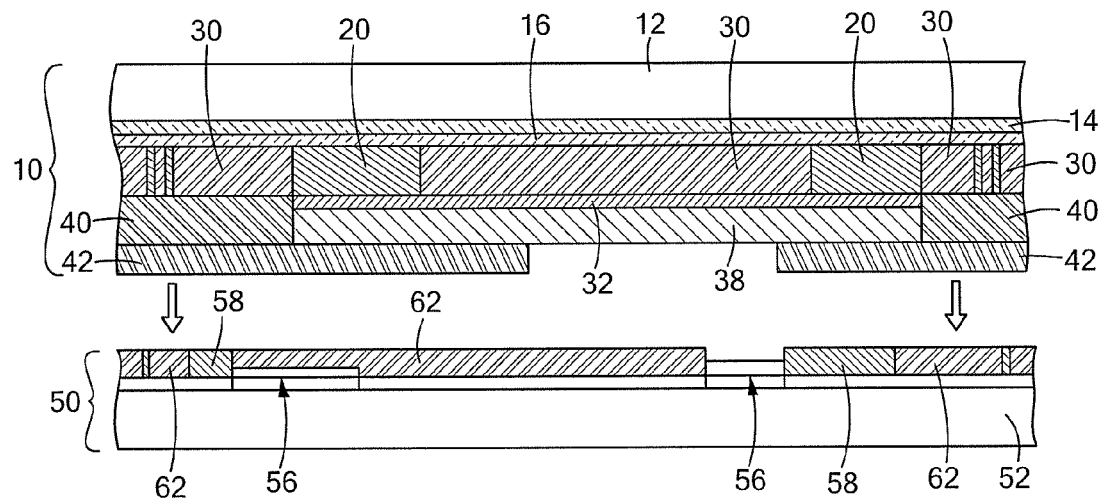
FIGS. 3A through 3D are simplified cross-sectional views showing the bonding of the an electrical interconnect structure and the active device structure at various stages thereof.
Figure 3B:
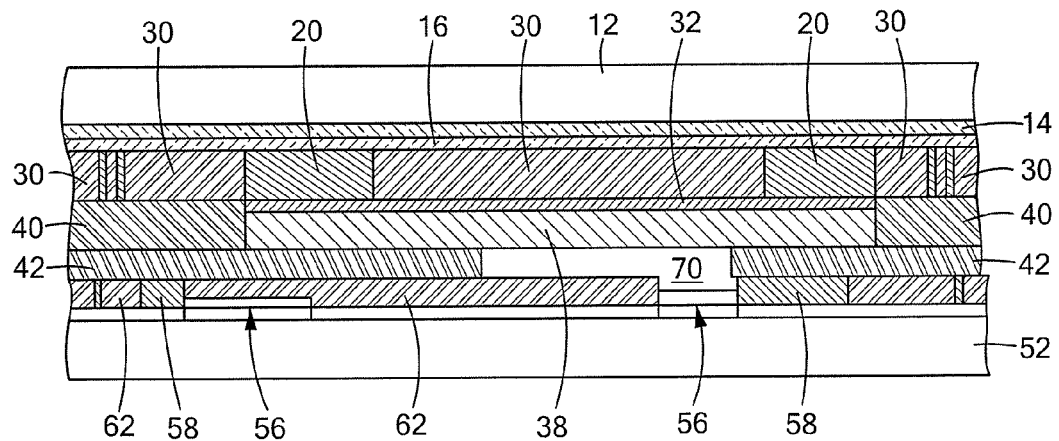
Figure 3C:
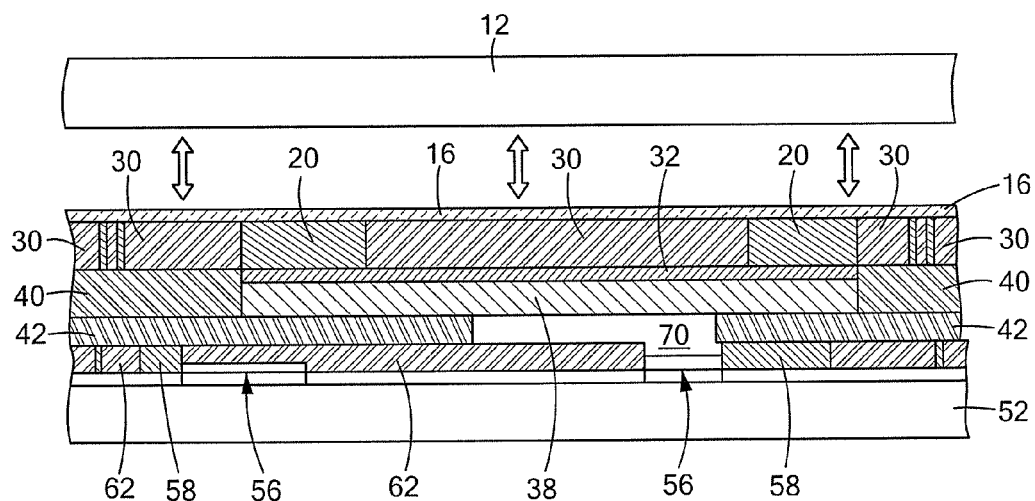
Figure 3D:
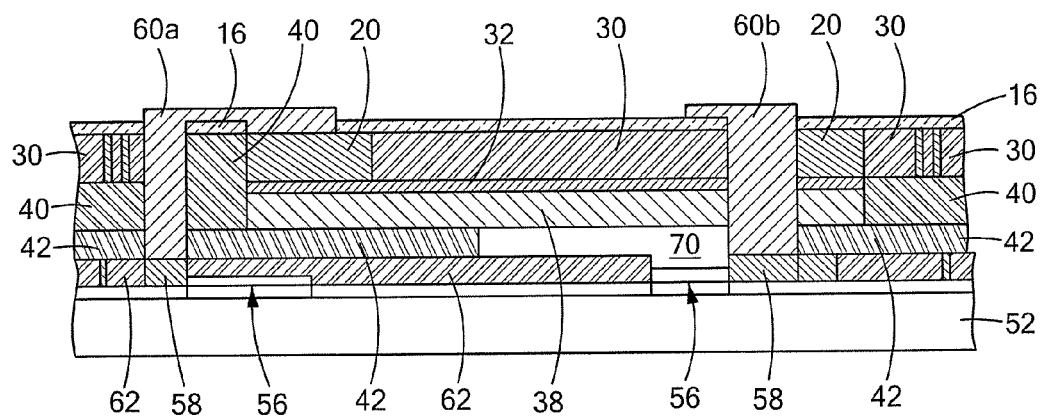

Having formed the interconnect sub-assembly structure 10 and the active device sub-assembly or structure 50, the two structures 10, 50 are aligned with the alignment marks (FIG. 3A) and then bonded together (FIG. 3B), here, for example, by thermo-compression bonding. Next, the release layer 14 is removed, here by using a suitable chemical such as for example sodium borate, potassium borate or other aqueous developer thereby removing the low cost transparent substrate thereby removing the substrate low cost transparent 12 (FIG. 3C). Next, the bonded structure is processed using conventional photolithography and plating to form electrical interconnects between the interconnect sub-assembly structure and the active device sub-assembly or structure, as shown in FIG. 3D. More particularly, a vias are formed, here by, for example, layer ablation or chemical etching, through the layer 40 and processed in any convectional manner to form an electrical interconnects 60a, 60b thereby electrically interconnecting passive conductor 20, conductor 32 and conductor 38, as indicated and active elements 56a, 56b, here for example individual FETS or MEMs, or SAW devices. It is noted that there is an air gap 70 over the individual active elements 56a, 56b.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A package for a plurality of semiconductor devices, comprising:
    an electrical interconnect structure disposed over the plurality of semiconductor devices;
    an active device structure bonded to the electrical interconnect structure, the active device structure comprising;
    a semiconductor substrate, the semiconductor substrate having the plurality of semiconductor devices, the active device structure having a first polymer layer on a portion of a surface thereof;
    wherein the electrical interconnect structure has a second polymer layer on a surface thereof and wherein the first polymer layer on the active device layer structure is in direct contact with and bonded to the second polymer layer on the electrical interconnect structure to bond the active device structure to the electrical interconnect structure;
    wherein the electrical interconnect structure has a first portion of an the electrical interconnecting arrangement on a lower surface of the electrical interconnect structure;
    wherein the electrical interconnect structure has a second portion of the electrical interconnecting arrangement is on an upper surface of the interconnecting structure;
    wherein the active device structure has a third portion of the electrical interconnecting arrangement; and
    wherein an electrical via passes between the first portion of the electrical interconnecting arrangement, and the second portion of the electrical interconnecting arrangement to the third portion of the electrical interconnecting arrangement to provide electrical interconnection among the semiconductor devices on the semiconductor substrate.

2. A method for packaging a plurality of semiconductor devices, comprising:
    forming an electrical interconnect structure, comprising:
        a support substrate;
        a release layer on a first surface of the support substrate; and
        an electrical interconnect structure over the release layer; and
    forming a first uncured polymer layer on a portion of a second surface of the support substrate;
    forming an active device structure, comprising:
        forming the plurality of semiconductor devices on an active device semiconductor substrate;
        forming a second uncured polymer layer on a portion of a surface of the active device structure;
    bonding the electrical interconnect structure to the active device structure comprising:

contacting the first polymer layer and the second polymer layer together, one of the polymer layers being uncured;

thermocompression bonding the first polymer layer to the second polymer layer;

removing the support substrate from the bonded electrical interconnect structure and the active device structure; and electrically interconnecting the electrical interconnect structure of the electrical interconnect structure to the active semiconductor devices to electrically interconnect the semiconductor devices.

3. The method recited in claim 2 the wherein the electrically interconnecting comprises forming a via through the first polymer layer.

4. The method recited in claim 3 wherein the removing comprises chemically removing the release layer.

5. The method recited in claim 3 wherein the removing comprises dissolving the release layer.

6. The method recited in claim 3 wherein the electrical interconnect structure comprises a laminated structure comprising a plurality of patterned electrical interconnect layers, the one of the patterned electrical interconnect layers being separated another one of the patterned electrical interconnect layers by a dielectric layer.

7. A method for packaging a plurality of semiconductor devices formed in a surface portion of a semiconductor wafer, such method comprising:

forming an electrical interconnect structure, such interconnect structure comprising:
a support substrate;
a release layer on the support substrate; and
an electrical interconnect over the release layer;

forming an active device structure, comprising:
forming the plurality of semiconductor devices in the surface portion of the surface of the semiconductor wafer;

bonding the electrical interconnect structure to the active device structure;

removing the support substrate from the bonded electrical interconnect structure and the active device structure comprising chemically removing the release layer; and making an electrical interconnection between of the electrical interconnect and the plurality of semiconductor devices.

8. The method recited in claim 7 wherein the completing the electrical interconnection includes forming a via through the formed electrical interconnect structure to electrically interconnect the electrical interconnect of the electrical interconnect structure to frelectrical interconnect the semiconductor devices.

9. A method for packaging a plurality of semiconductor devices formed in a surface portion of a semiconductor wafer, such method comprising:

forming an electrical interconnect structure, such interconnect structure comprising:
forming a first portion of an electrical interconnect arrangement;

forming an active device structure, comprising:
forming the plurality of semiconductor devices in the surface portion of the surface of the semiconductor wafer and a second portion of the electrical interconnect arrangement on another surface portion of the semiconductor wafer;

bonding the electrical interconnect structure to the active device structure ; and subsequent to the bonding, electrically interconnecting the first portion of the electrical interconnect arrangement to the second portion of the electrical interconnect arrangement to electrical interconnect the semiconductor devices.

10. The method recited in claim 9 comprising: applying a first polymer layer to a first surface of the electrical interconnect structure and applying a second polymer layer to a second surface of the active device structure; contacting the first polymer and the second polymer; and thermocompression bonding the first polymer layer and the second polymer layer.

11. The method recited in claim 10 wherein the first polymer layer and the second polymer layer are uncured prior to the thermocompression bonding.

12. The method recited in claim 11 the wherein the electrically interconnecting comprises forming a via through the electrical interconnect structure to electrically interconnect the first portion of the electrical interconnect arrangement to the second portion of the electrical arrangement.

13. The method recited in claim 12 wherein the first portion of an electrical interconnect arrangement is a laminated structure comprising a plurality of patterned electrical interconnect layers, one of the patterned electrical interconnect layers being separated from another one of the patterned electrical interconnect layers by a dielectric layer.

14. The method recited in claim 13 wherein the electrically interconnecting comprises forming a via through the first polymer layer.

15. The method recited in claim 13 wherein the removing comprises chemically removing the release layer.

16. The method recited in claim 15 wherein the removing comprises dissolving the release layer.

* * * * *